(12) United States Patent
Chuang et al.

(10) Patent No.: US 6,894,318 B2
(45) Date of Patent: May 17, 2005

(54) DIODE HAVING A DOUBLE IMPLANTED GUARD RING

(75) Inventors: Ming-Yeh Chuang, McKinney, TX (US); William C. Loftin, Plano, TX (US); Scott K. Montgomery, Rowlett, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/644,536

(22) Filed: Aug. 20, 2003

(65) Prior Publication Data

US 2005/0040489 A1 Feb. 24, 2005

(51) Int. Cl.[7] ............................................. H01L 29/36
(52) U.S. Cl. ....................... 257/109; 257/106; 438/328; 438/983
(58) Field of Search ................................ 257/109, 106, 257/112, 577; 438/328, 983

(56) References Cited

U.S. PATENT DOCUMENTS

| 4,134,123 A | | 1/1979 | Shannon |
| 5,119,160 A | * | 6/1992 | Hall ............................ 257/370 |
| 5,907,179 A | * | 5/1999 | Losehand et al. ........... 257/475 |
| 6,426,541 B2 | | 7/2002 | Chang et al. |
| 2004/0150072 A1 | * | 8/2004 | Schnitt et al. ............... 257/629 |

* cited by examiner

*Primary Examiner*—Eddie Lee
*Assistant Examiner*—Douglas W. Owens
(74) *Attorney, Agent, or Firm*—Yingsheng Tung; Wade James Brady, III; Frederick J. Telecky, Jr.

(57) ABSTRACT

The present invention provides a diode 200 that includes a substrate 215 doped with a first type dopant and a double implanted guard ring 245 located within the substrate and doped with a second type dopant opposite the first type dopant and having a first doped profile region 245a and a second doped profile region 245b. The present invention also includes a method of manufacturing this diode and an integrated circuit that utilizes this diode 200 within a CMOS and bipolar transistor integrated circuit 600.

18 Claims, 6 Drawing Sheets

DIODE HAVING A DOUBLE IMPLANTED GUARD RING

TECHNICAL FIELD OF THE INVENTION

The present invention is directed in general to a diode semiconductor device having an implanted guard ring and, more specifically, to a diode having a double implanted guard ring and method of fabrication thereof.

BACKGROUND OF THE INVENTION

Figure 1A:
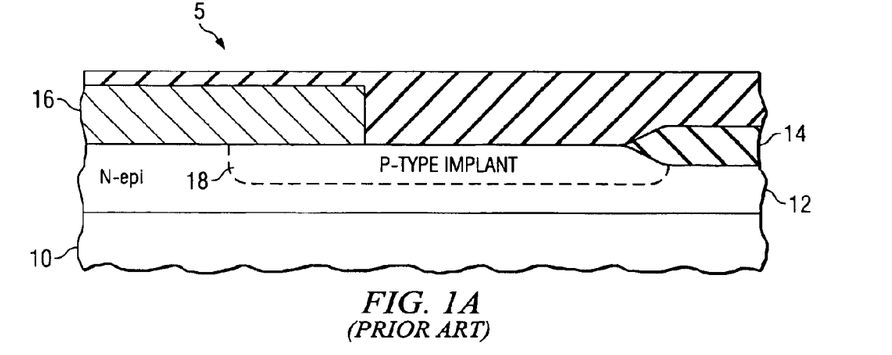
FIG. 1A illustrates cross-sectional view of a prior art Schottky diode.

Schottky diodes are well known in the electronics industry. The popularity of their use primarily stems from the fact that they have a very low forward voltage drop and switching speeds that approach zero time making them ideal for a number of power applications. A prior art Schottky diode 5 is illustrated in FIG. 1A. As shown, a typical prior art Schottky diode includes a silicon substrate 10 that has an n-doped epi layer 12 formed thereon. Typically formed from the silicon substrate 10 is an isolation region 14, such as a field oxide region, and located on the epi layer 12 is a Schottky electrode 16, which is typically comprising titanium. Located between the electrode 16 and the isolation region 14 is an implanted p-type guard ring 18.

Unfortunately, however, due to a radius of curvature effects and process damages at the edges of the Schottky barrier, during operation, a field quickly builds up when a reversed bias is applied to the diode. This leads to a low breakdown voltage and poor leakage characteristics. Breakdown voltage has traditionally been improved by placing the diffused p-type guard ring 18 around the Schottky barrier, with the p guard ring short-circuited to the anode (metal plate) of the Schottky diode. This relieves the field, giving rise to a higher reversed bias voltage before substantial reversed current leakage occurs.

While, these prior art diodes have worked satisfactorily at lower reversed bias voltages, there has been an increase in the number of higher voltage output applications involving such diodes. For example, in telecommunication applications, the increase demand for high-speed Internet connections, such as DSL, has required an operating voltage in excess of 25 volts and in many cases in excess of 28 volts or greater. While operating in the forward bias direction, the Schottky diodes, as illustrated in FIG. 1A, perform at an acceptable voltage with little current leakage. However, in the reversed bias mode, these same diodes suffer from an unacceptably high amount of current leakage. They have either a constantly rising current leakage as the reversed bias voltage is increased or a sharp sudden increase in current leakage at high reversed bias voltages.

Figure 1B:
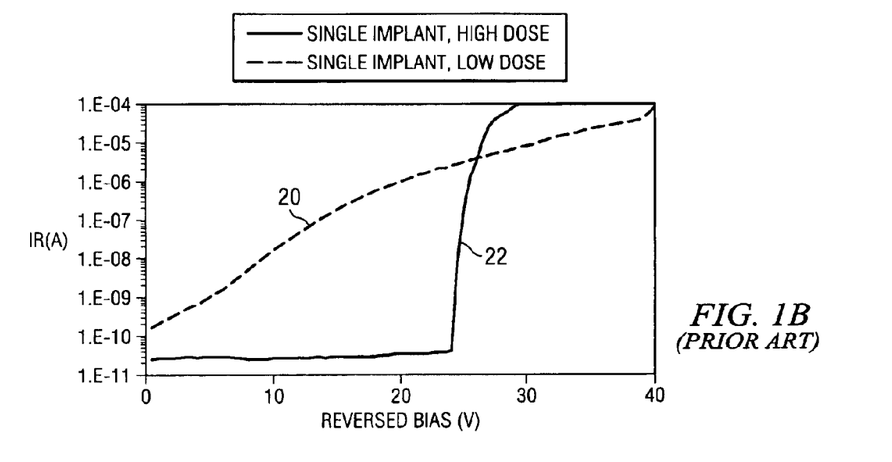
FIG. 1B illustrates a graph of a reversed bias versus reversed leakage graph of a prior art Schottky diode.

This effect is illustrated in FIG. 1B that shows a prior art Schottky diode. The graph line designated by reference number 20 shows a Schottky diode having a single implanted guard ring with a low doping concentration. As seen from this graph, the current leakage represented by the Y axis shows a steady increase as the reversed biased voltage, which is represented by the X axis increases. The graph line designated by reference number 22 shows a Schottky diode also having a single implanted guard ring but with a lower doping concentration. In this particular instance, the current leakage stays well below 1E-10 until the reversed bias voltage reaches about 24 volts. At that point, however, the current leakage increases exponentially to around 1E-04. Thus, as seen from this figure, either Schottky diode would be undesirable where the device is expected to operate at reversed biased voltages of 25 volts or more.

Accordingly, what is needed in the art is a diode that will operate at high reversed bias voltages without exhibiting the high current leakage as presently found in prior art diodes.

SUMMARY OF THE INVENTION

To address the above-discussed deficiencies of the prior art, the present invention provides a diode having a double implanted guard ring. In one embodiment, the diode comprises a substrate doped with a first type dopant and a double implanted guard ring located within the substrate and doped with a second type dopant opposite the first type dopant and having a first doped profile region and a second doped profile region.

In another embodiment, the present invention provides a method of fabricating a diode in an integrated circuit. This particular method includes doping a substrate with a first type dopant and forming a double implanted guard ring within the substrate by doping with a second type dopant opposite the first type dopant and having a first doped profile region and a second doped profile region.

In yet another embodiment, there is provided an integrated circuit that comprises a plurality of CMOS transistors having CMOS, a plurality of bipolar transistors, and a plurality of diodes. In a preferred embodiment, each of the diodes includes a substrate doped with a first type dopant, an electrode located over the substrate, an isolation region located adjacent the electrode, and a double implanted guard ring located within the substrate and doped with a second type dopant opposite the first type dopant and having a first doped profile region and a second doped profile region, wherein the second doped region is located at least partially within the first doped profile region and a plurality of interconnects that interconnect said plurality of CMOS transistors, bipolar transistors.

The foregoing has outlined preferred and alternative features of the present invention so that those of ordinary skill in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features may not be drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

The present invention recognizes the advantages of using a guard ring that provides a diode having a much higher reversed biased voltage before significant reversed current leakage takes place when compared to prior art diodes. The diodes provided by the present invention are, therefore, excellent for application in higher power devices that are beginning to grow in demand for various telecommunication applications, such as high-speed Internet access and other high power electronic applications. Additionally, as is the case in most semiconductor manufacturing processes, ease of integration into existing fabrication process is highly desirable as it reduces costs and unpredictable process variables. The present invention in both apparatus and method embodiments can integrate easily into existing complementary metal oxide semiconductor (hereinafter referred to as CMOS) and bipolar-CMOS (herein after referred to as BICMOS) fabrication processes.

The present invention further recognizes that the impact ionization energy can be significantly decreased by implanting the guard ring in such a way to provide substantial coverage of the electrical field that extends through the substrate and the isolation region of the device during operation. This results in a more robust device by reducing the potential for avalanche multiplication that contributes to early breakdown. By partially, substantially, or fully covering the electric field at the edge of the implant region and under the isolation region, reversed biased voltage breakdown can be significantly increased, thus allowing for higher voltage applications with significantly reduced reversed current leakage.

Figure 2:
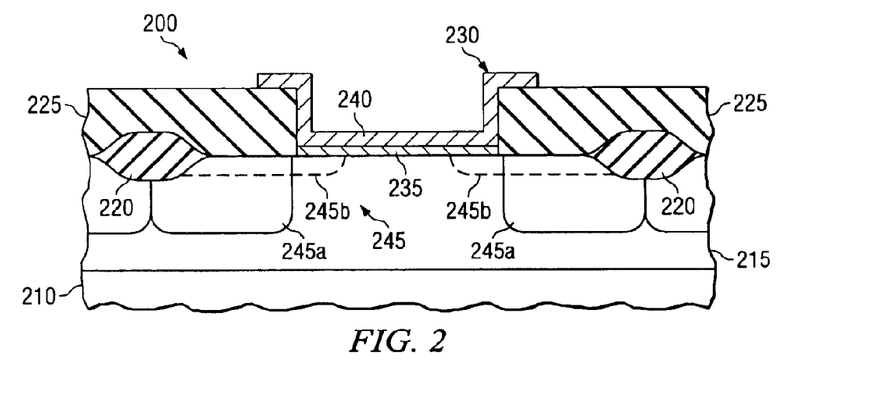
FIG. 2 illustrates a sectional view of a diode as provided by an embodiment of the present invention.
Figure 6:
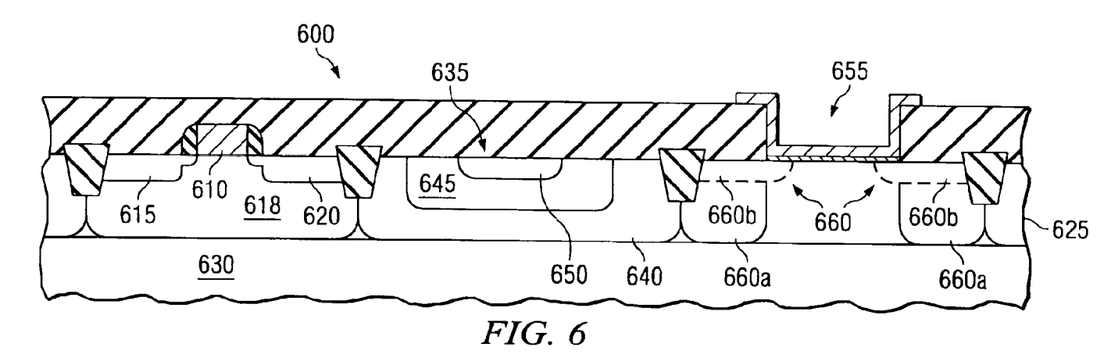
FIG. 6 represents a sectional view of a partially completed BICMOS integrated circuit incorporating an embodiment of the diode as provided by the present invention.
Figure 7:
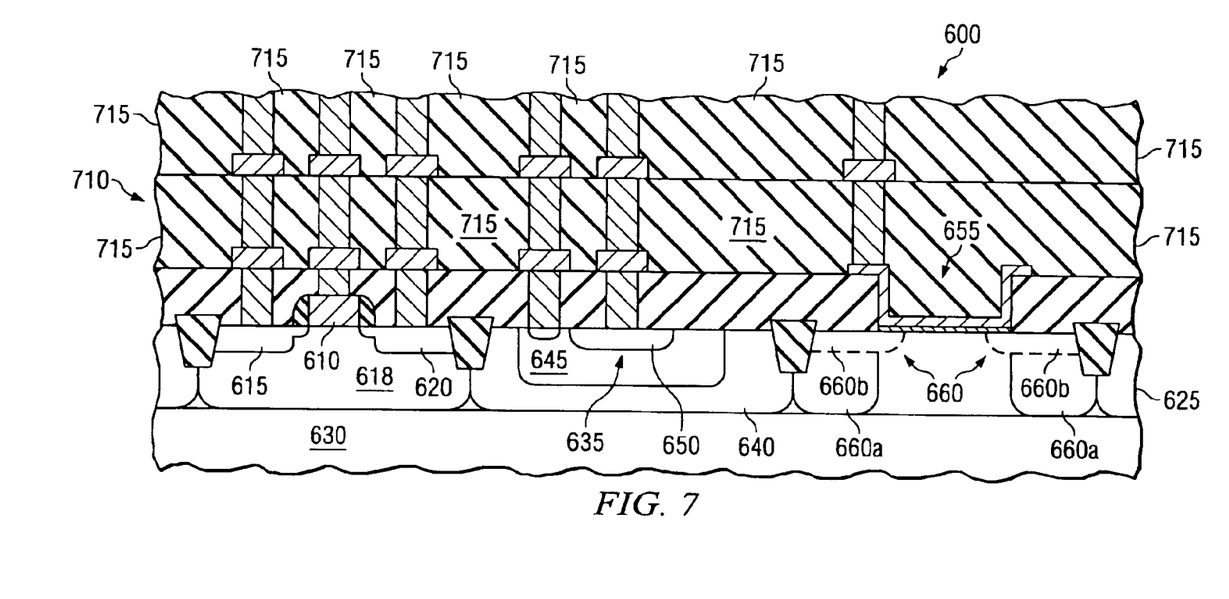
FIG. 7 represents a sectional view of a completed integrated circuit of FIG. 6 with interconnects.

Turning initially to FIG. 2, there is illustrated an embodiment of a diode 200, such as a Schottky diode, as provided by the present invention. This particular embodiment includes a substrate 210, such as a conventional silicon substrate. The diode 200 may further include a conventionally formed buried insulator or oxide layer, which is not illustrated but which certainly can be incorporated into the structure, if design so requires. Located over the substrate 210 is a conventionally grown doped epi layer 215. Preferably, the epi layer 215 is doped with an n-type dopant, such as arsenic or phosphorous. However, it is not intended to limit this embodiment or the present invention to any specific doping scheme and all doping schemes as discussed herein may be reversed. The diode 200 further includes isolation regions 220. The isolation regions 220 may be conventionally grown field oxide regions or conventionally formed trench isolation regions as illustrated in FIGS. 6 and 7 below. Located over the epi layer 215 and the isolation regions 220 is a conventionally formed inter level dielectric layer 225. As explained below in more detail, this dielectric layer 225 is patterned using conventional lithographic techniques and an electrode 230 is formed therein using conventional sputter deposition processes.

In an exemplary aspect, the electrode 230 includes two layers. The first is a metal silicide layer 235. The metal used to form the silicide with the under lying silicon may vary. For example, the metal used to form the silicide may be titanium, platinum or other well known conductive metals. However, in a preferred example, the metal silicide layer 235 is platinum silicide, which forms a good Schottky contact with the underlying epi layer 215. The second layer 240 is a metal layer and is, preferably, a metal stack layer, which may be comprised of a titanium/titanium tungsten/aluminum copper stack. Other metal combinations well known to those skilled in the art, of course, may also be used.

The diode 200 further includes a double implanted guard ring 245 located within the epi layer 215 and located near a perimeter of the electrode 230. The guard ring 245 is doped with a dopant that is opposite to the dopant used to dope the epi layer 215. For example, if the epi layer 215 is doped with an n-type dopant, then the guard ring will be doped with a p-type dopant. While this will be the case in most applications, it should be understood that the dopants may be reversed if design or functions so require. The double implanted guard ring 245 includes a first doped profile region 245a and a second doped profile region 245b. In the illustrated embodiment of FIG. 2, the second doped profile region 245b is located at least partially within the first doped profile region 245a. However, in another aspect, the second doped profile region 245b may be located entirely within the first doped profile region 245a. Also as illustrated, the first doped profile region 245a preferably lays outside a footprint of the electrode 230 while the second doped profile region 245b is within the footprint of the electrode 230 but near an outer perimeter of the electrode 230. These locations are advantageous because they provide more use area of the electrode 230. Alternatively, however, the first doped profile region 245a may extend under the electrode 230 as well.

Figure 3A:
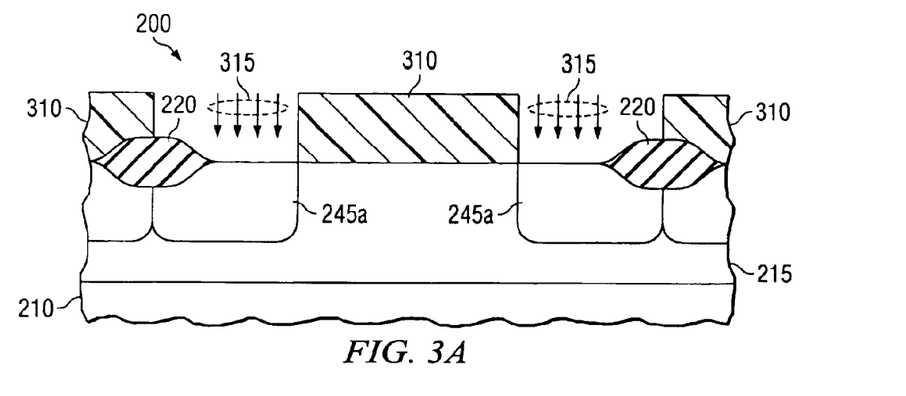
FIGS. 3A–3E illustrate various process stages in the manufacture of the diode illustrated in FIG. 2.

Turning now to FIGS. 3A–3E, there are illustrated various process stages in the manufacture of the diode 200 illustrated in FIG. 2, which will now be explained in more detail. With reference to FIG. 3A, there is shown the step of forming the first doped profile region 245a in the epi layer 215. As seen from this illustration, the epi layer 215 and the isolation regions 220 have already been formed using conventional process, and the surface of the diode 200 has been masked with a patterned masking layer 310, such as a photoresist. Other times, however, the isolation regions 220 are formed after the first doped profile region 245 and serve the same purpose.

The epi layer is preferably doped with an n-type dopant and has a thickness of ranging from about 4 $\mu$m to about 6, with a preferred thickness being about 5.2 $\mu$m. During this step, a dopant 315 opposite to that used to dope the epi layer 215 is implanted into the epi layer 215. For example, if the epi layer 215 is doped with an n-type dopant, the first doped profile region 245a will be doped using a p-type dopant, such as boron. The doping concentration and implant energies used to implant this region may vary, but preferably, the implant concentration and implant energies are the same as those used to form Pwells in a CMOS or bipolar region located on the same substrate 210, 215. For example, the doping concentration can range from about 2E15 atoms/cm$^3$ to about 1E16 atoms/cm$^3$ with the preferred concentration being about 6E15 atoms/cm$^3$ while the implant energy may range from about 40 keV to about 60 keV with the preferred implant energy being about 60 keV. A preferred dose for achieving a concentration within this range is about 2.3E12 atoms/cm$^{-2}$. In a more advantageous embodiment, however, the first doped profile region 245a is formed simultaneously with the Pwell formation in a CMOS region or a bipolar region of an integrated circuit device.

As shown in FIG. 3A, the first doped profile region 245a extends under the isolation regions 220. The degree or distance to which it extends can vary, depending on the layout, thermal budget and implant energies used, the direction of the implant or other implant parameters. As explained below, the first doped profile region 245a preferably extends far enough under the isolation region 220 to substantially or fully cover the electric field that passes through the isolation region 220 during operation of the diode.

Figure 3B:
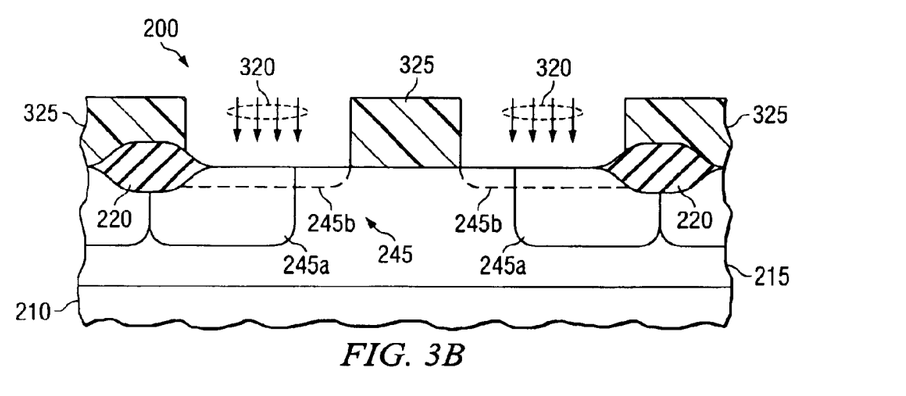

Turning now to FIG. 3B, there is illustrated the step of forming the second doped profile region 245b. The second doped profile region 245b is shown as a dotted line for illustration purposes. In this particular embodiment, the second doped profile region 245b is formed implanting a dopant 320 that is of the same type as the first doped profile region 245a, but at a greater doping concentration through a conventionally formed mask layer 320. For example, if the concentration of the first doped profile region 245a is 6.0E15 atoms/Cm$^3$, then the concentration of the second doped profile region 245b may be 5.0E19 atoms/cm$^3$. A preferred dose rate for achieving a concentration within this range is 3E15 cm$^{-2}$. Again, these concentrations are given by way of examples only, and it should be understood that these concentrations may vary depending on design specifications. This implant step may also be conducted at the same implant energies and concentrations as those conducted to form source/drain regions in a CMOS region of the integrated circuit, which are not shown here. Moreover, the formation of the second doped profile region 245b may be conducted simultaneously with the formation of the source/drain regions in the CMOS regions.

Figure 3C:
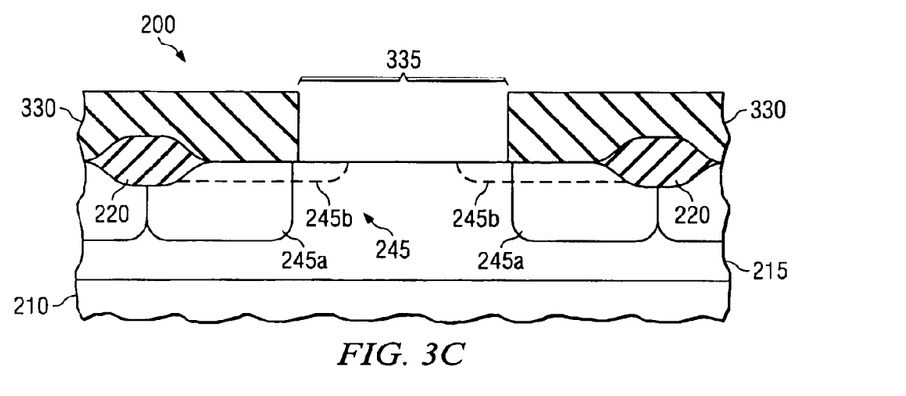

Turning next to FIG. 3C there is illustrated the diode 200 of FIG. 3B after the implant of the second doped profile region 245b and removal of the photoresist layer 325. In this exemplary embodiment, a dielectric level 330, for example, silicon dioxide or fluorosilicate glass (FSG) has been conventionally deposited and patterned to form an opening 335. In many cases, the patterning process is a high energy plasma etch which can damage the sides of the opening. In such instances, the second doped profile region 245b helps to form a good ohmic contact regardless of the damage and provide the other advantage discussed above.

Figure 3D:
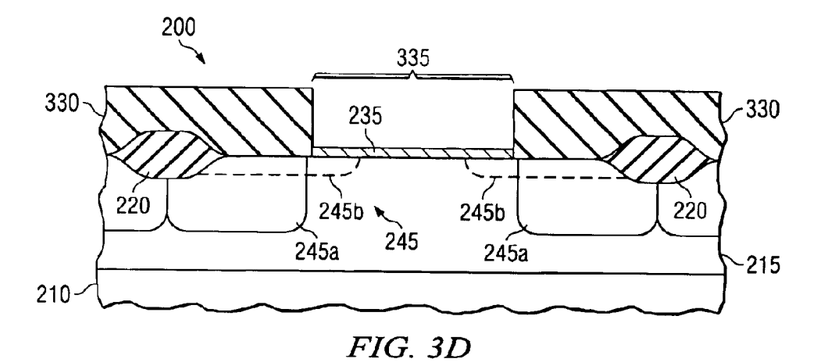

After the opening 335 is formed, the metal silicide layer 235 of the electrode 230 (FIG. 2) is formed within the opening 335, as shown in FIG. 3D. Various conventional deposition techniques may be used. However, in one particular aspect of the present invention, sputter deposition is used to deposit a metal onto the substrate 215, after which the metal is annealed to form the silicide layer 235. In one aspect, the thickness of the silicide layer is 30 nm. The choice of metal also can vary depending on design specifications. For example, the metal may be titanium, gold, silver, tungsten, copper or platinum. In a preferred application, however, the metal is platinum. In such instances, a platinum target is used to sputter the metal onto the substrate 215, after which a platinum silicide is formed.

Figure 3E:
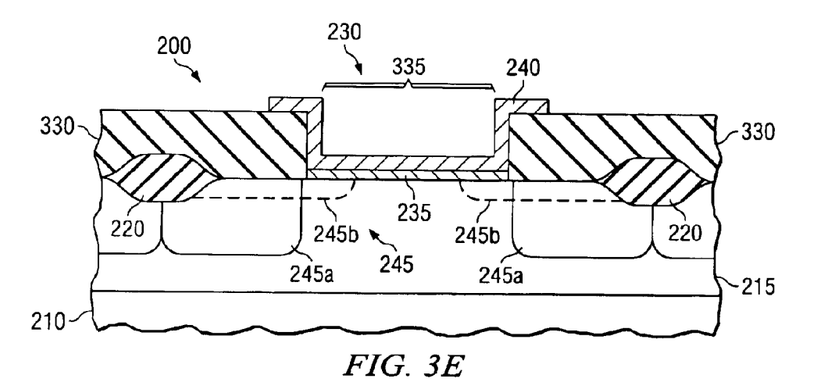

FIG. 3E next illustrates the diode 200 of FIG. 3D after the deposition of the second metal layer 240 of the electrode 230 in the opening 335 and on the metal silicide layer 235. Preferably, this second metal layer 240 is a metal stack layer as discussed above and may be deposited using conventional deposition processes.

Figure 4A:
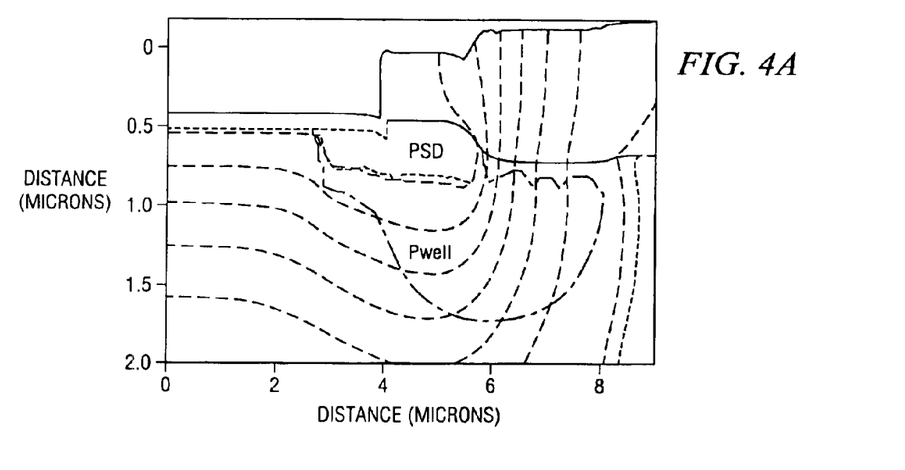
FIG. 4A illustrate a potential contour graph of an electric field extending through a double implanted ring and the isolation region of a diode as provided an embodiment of the present invention.
Figure 4B:
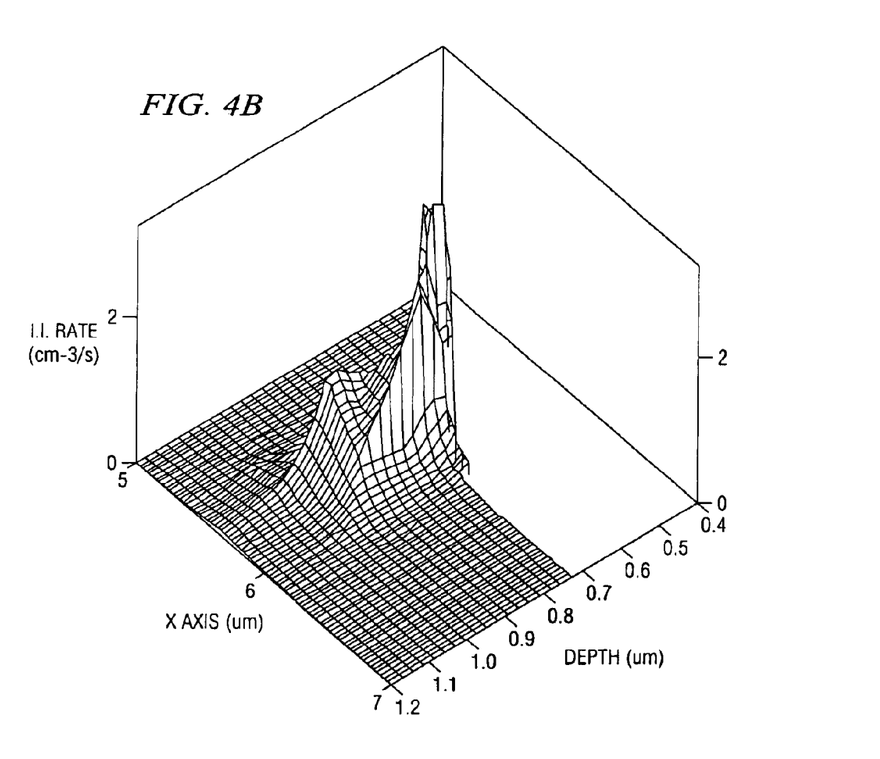
FIG. 4B illustrates a three dimensional view of an impact ionization graph of diode as provided an embodiment of the present invention.
Figure 4C:
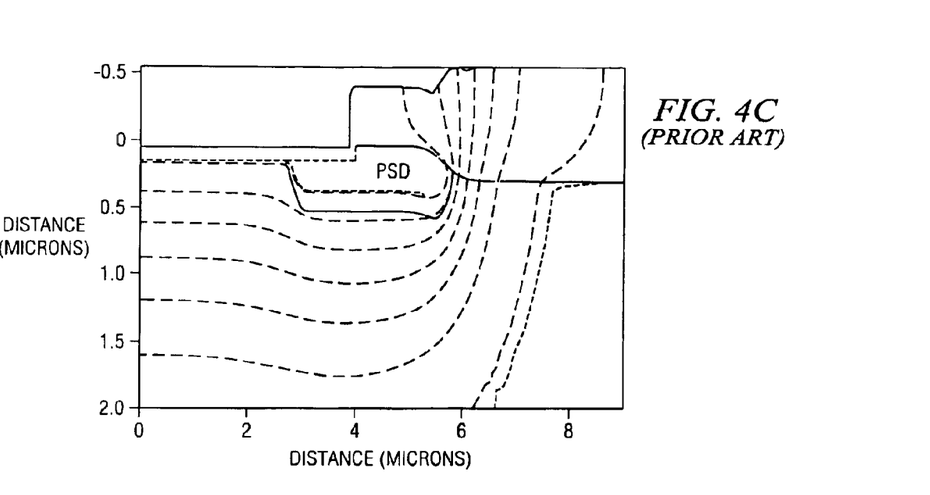
FIG. 4C illustrate a potential contour graph of an electric field extending through a implanted ring and the isolation region of a prior art diode.
Figure 4D:
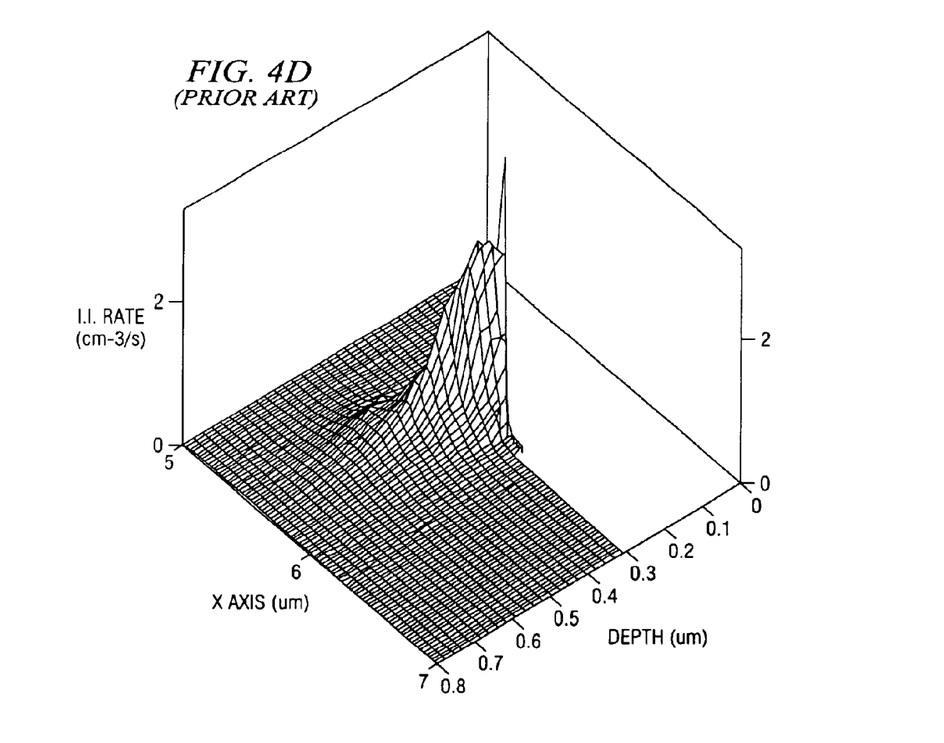
FIG. 4D illustrates a three dimensional view of an impact ionization graph of the prior art diode of FIG. 4C.

The double guard ring diode as covered by the present invention provides several advantages over prior art diodes. One such advantage is apparent from FIGS. 4A–4D. FIG. 4A is a potential contour graph of an electric field of a diode as covered by one embodiment of the present invention, and FIG. 4B is an ionization impact graph of that same diode. In contrast, FIG. 4C is a potential contour graph of an electric field of a prior art diode that does not have a double implanted guard ring, and FIG. 4D is an ionization impact graph of that same prior art diode. As seen in FIG. 4A, the presence of the double guard ring spreads out the electric field at the guard ring/field oxide interface, which results in a lower impact ionization number of about 3E17 cm$^{-3}$/s, as shown in FIG. 4B. In contrast to this, as seen from FIG. 4C, the electric field is more compact at the guard ring and field oxide region interface of the prior art diode, which results in a substantially higher impact ionization number of about 3.6E18 cm$^{-3}$/s, as shown in FIG. 4D. Thus, from this comparison, it is readily seen that the double implanted guard ring diode provides lower impact ionization energy, which in turn provides a diode having a higher reversed bias breakdown voltage before substantial reversed current leakage occurs.

The degree of spread of the electric field is believed to be a function of how far under the isolation region that the first doped profile region 245a extends. In the potential contour graph shown in FIG. 4A, the first doped profile region 245a extends about 3 $\mu$m under isolation region 220. In alternative embodiments, the first doped profile region 245a may only extend under the isolation region 220 by about 1 or 2 $\mu$m where the degree of electric field spread would be less. However, it is believed that these alternative embodiments would also afford advantages over the prior art diodes because the spreading of the electric field would also reduce the impact ionization at the guard ring/isolation region interface.

Figure 5:
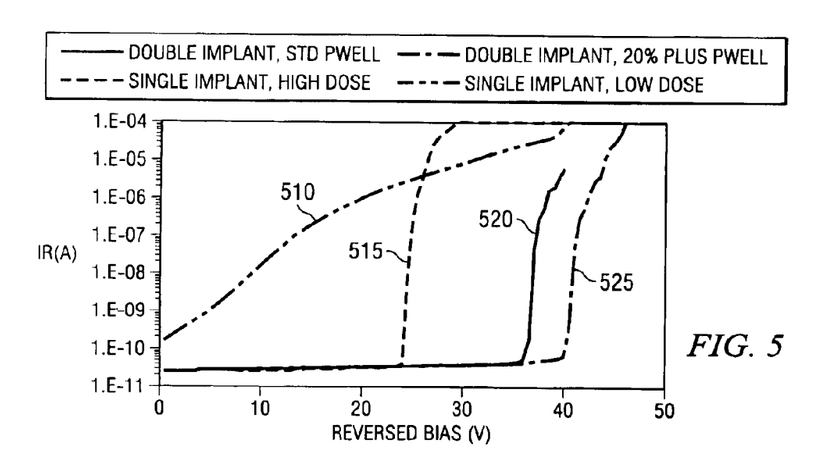
FIG. 5 represents a comparison graph of the reversed bias leakage and reversed biased voltage of prior art diodes and embodiments of diodes as provided by the present invention.

Turning now to FIG. 5, there is shown a comparison graph of reversed current leakage versus reversed bias voltage of prior art diodes, represented by graph lines 510 and 515 and diodes provided by different embodiments of the present invention, represented by graph lines 520 and 525. Graph line 520 is a diode fabricated by the processes discussed above where the first doped profile region 245a (FIG. 2) has been doped with a standard PWELL implant. Graph line 525, on the other hand, is a diode fabricated by the processes discussed above except the first doped profile region 245a (FIG. 2) has been doped with a 20% plus Pwell implant. As seen from this graph, it is recognized that the reversed bias voltage can be increased by varying the dopant concentration in the double implanted guard ring before substantial reversed leakage occurs. It is also readily apparent that the reversed bias voltage of the diodes provided by the present invention is substantially improved over the prior art diodes.

Turning now to FIG. 6, there is illustrated a sectional view of a partially completed integrated circuit 600 in which the diode of the present invention may be incorporated. The integrated circuit 600 includes, in one embodiment, a conventionally formed NMOS transistor 610 of a CMOS device having source/drains 615, 620 formed in a Pwell 61B of an epi layer 625, which in turn is located over a substrate 630. The epi layer 625 may be of the same type and fabricated in the same way as discussed above with respect to FIG. 2 and FIGS. 3A–3E. The integrated circuit 600 also includes a conventionally formed bipolar device 635 having a collector 640, a based 645 formed in the collector, and an emitter 650 formed in the base. Finally, the integrated circuit also includes the diode 655, as discussed above with respect to FIG. 2 and FIGS. 3A–3E and having double implanted guard rings 660. Given the discussion above with respect to the diode 655, one who is skilled in the art would know how to incorporate the diode 655 into the integrated circuit 600. The Pwell 618, the collector 640 and the first doped profile region 660a may all have the same doping concentration, while the source/drains 615, 620 and the second doped profile region 660b may have the same doping concentration. It should be noted that while these devices have been shown side by side, it has been done so for illustrative purposes and, it should be understood that the layout configuration of the integrated circuit 600 is not limited to this layout configuration.

Turning now to FIG. 7, there is shown a cut-a-way view of the integrated circuit 600 of FIG. 6 subsequent to the formation of interconnect structures 710 formed within interlevel dielectric layers 715. As with the integrated circuit 600, given the disclosure presented herein, one who is skilled in the art would understand how to form such interconnects to interconnect the various devices to form an operative integrated circuit.

Although the present invention has been described in detail, one of ordinary skill in the art should understand that they can make various changes, substitutions and alterations herein without departing from the scope of the invention.

What is claimed is:

1. A diode, comprising:
    a substrate doped with a first type dopant;
    a double implanted guard ring located within said substrate and doped with a second type dopant opposite said first type dopant and having a first doped profile region and a second doped profile region;
    an electrode located over said substrate;
    an isolation region located adjacent said electrode; and
    said first doped profile region having a profile that substantially covers an electric field extending through said isolation region and said substrate during operation of said diode.

2. The diode as recited in claim 1 further including an electrode located over said substrate and an isolation region located adjacent said electrode, wherein said first doped profile region extends more than about 1μm under said isolation region.

3. The diode as recited in claim 2 wherein said guard ring has a profile that provides an impact ionization rate of about 3E17 cm$^{-3}$/second at an interface of said guard ring and said isolation region during operation of said diode.

4. The diode as recited in claim 2 wherein said diode has a reversed breakdown voltage ranging from about 28 volts to about 36 volts or greater and with a leakage current of less than about 1E-10 amperes.

5. The diode as recited in claim 1 wherein said first doped profile region has a doping concentration less than said second doped profile region.

6. The diode as recited in claim 5 wherein said first doped profile region has a p-type doping concentration of about 6E15 atoms/cm$^3$ and said second doped profile region has a p-type doping concentration of about 5e19 atoms/cm$^3$.

7. The diode as recited in claim 1 wherein said second doped region is located at least partially within said first doped profile region.

8. A method of fabricating a diode in an integrated circuit, comprising:
    doping a substrate with a first type dopant;
    forming a double implanted guard ring within said substrate by doping with a second type dopant opposite said first type dopant to form a first doped profile region and a second doped profile region;
    forming an electrode over said substrate; and
    forming an isolation region adjacent said electrode such that said first doped profile region has a profile that substantially covers an electric field extending through said isolation region and said substrate during operation of said diode.

9. The method as recited in claim 8 further including forming an electrode over said substrate and forming an isolation region adjacent said electrode such that said first doped profile region extends more than about 1 μm under said isolation region.

10. The method as recited in claim 9 wherein forming said guard ring includes forming said guard ring to have a profile that provides an impact ionization rate of about 3E17 cm$^{-3}$/second at an interface of said guard ring and said isolation region during operation of said diode.

11. The method as recited in claim 9 wherein said diode has a reversed breakdown voltage ranging from about 28 volts to about 36 volts or greater and with a leakage current of less than 1E10 amperes.

12. The method as recited in claim 8 further including forming well regions and source/drain regions for a plurality of transistors and wherein said first doped profile region is a well region formed simultaneously with said well regions of said plurality of transistors and said second doped profile is a source/drain region formed simultaneously with said source/drain regions of transistors.

13. The method as recited in claim 8 wherein said first doped profile region has a doping concentration less than a doping concentration of said second doped profile region.

14. The method as recited in claim 8 wherein said second doped region is located at least partially within said first doped profile region.

15. An integrated circuit, comprising:
    CMOS transistors;
    bipolar transistors;
    diodes, wherein each diode includes:
        a substrate doped with a first type dopant;
        an electrode located over said substrate;
        an isolation region located adjacent said electrode; and
        a guard ring located within said substrate and doped with a second type dopant opposite said first type dopant and having a first doped profile region and a second doped profile region, wherein said second doped region is located at least partially within said first doped profile region; and wherein said first doped profile region extends more than about 1 μm under said isolation region such that said first doped profile region has a profile that substantially covers an electric field extending through said isolation region and said substrate during operation of said diode;
    interconnects that interconnect said CMOS transistors, bipolar transistors and diodes to form an operative integrated circuit.

16. The integrated circuit as recited in claim 15 wherein said guard ring has a profile that provides an impact ionization rate of about 3E17 cm$^{-3}$/second at an interface of said guard ring and said isolation region during operation of said diode.

17. The integrated circuit as recited in claim 15 wherein said CMOS transistors includes p-typed doped wells and p-type doped source/drains and each of said first doped profile regions is a well region having a doping concentration similar to said p-type doped wells and each of said second doped profiles is a source/drain region having a doping concentration similar to said p-type doped source/drains regions.

18. The integrated circuit as recited in claim 15 wherein said first doped profile region has a doping concentration less than a doping concentration of said second doped profile region.

* * * * *